United States Patent
Wang et al.

(10) Patent No.: US 11,715,792 B2
(45) Date of Patent: Aug. 1, 2023

(54) BARRIER STRUCTURE CONFIGURED TO INCREASE PERFORMANCE OF III-V DEVICES

(71) Applicant: Taiwan Semiconductor Manufacturing Co., Ltd., Hsin-Chu (TW)

(72) Inventors: Yun-Hsiang Wang, Hsin-Chu (TW); Chun Lin Tsai, Hsin-Chu (TW); Jiun-Lei Jerry Yu, Zhudong Township (TW); Po-Chih Chen, Hsinchu (TW); Chia-Ling Yeh, Jhubei (TW); Ching Yu Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 333 days.

(21) Appl. No.: 16/872,551

(22) Filed: May 12, 2020

(65) Prior Publication Data

US 2021/0242337 A1 Aug. 5, 2021

Related U.S. Application Data

(60) Provisional application No. 62/968,212, filed on Jan. 31, 2020.

(51) Int. Cl.
*H01L 29/66* (2006.01)
*H01L 29/778* (2006.01)
(Continued)

(52) U.S. Cl.
CPC ...... *H01L 29/7786* (2013.01); *H01L 29/2003* (2013.01); *H01L 29/205* (2013.01); *H01L 29/66462* (2013.01)

(58) Field of Classification Search
CPC ................................................ H01L 29/66462
See application file for complete search history.

(56) References Cited

U.S. PATENT DOCUMENTS

| 2010/0219452 A1* | 9/2010 | Brierley | ............... H01L 29/432 257/E21.403 |
| 2012/0056191 A1* | 3/2012 | Endo | ................... H01L 29/7787 257/E29.246 |

(Continued)

OTHER PUBLICATIONS

Eastman, L. "Undoped AlGaN/GaN HEMTs for Microwave Power Amplification" IEEE Trans. on Elec. Dev. vol. 48, No. 3 Mar. 2001 pp. 479-485 (Year: 2001).*

(Continued)

*Primary Examiner* — Grant S Withers
(74) *Attorney, Agent, or Firm* — Eschweiler & Potashnik, LLC (57) ABSTRACT

Various embodiments of the present disclosure are directed toward an integrated chip including an undoped layer overlying a substrate. A first barrier layer overlies the undoped layer. A doped layer overlies the first barrier layer. Further, a second barrier layer overlies the first barrier layer, where the second barrier layer is laterally offset from a perimeter of the doped layer by a non-zero distance. The first and second barrier layers comprise a same III-V semiconductor material. A first atomic percentage of a first element within the first barrier layer is less than a second atomic percentage of the first element within the second barrier layer.

20 Claims, 6 Drawing Sheets

(51) Int. Cl.
   *H01L 29/205*   (2006.01)
   *H01L 29/20*    (2006.01)

(56) References Cited

U.S. PATENT DOCUMENTS

2020/0127116 A1\*   4/2020   Chen .................. H01L 21/0254
2021/0320199 A1\*   10/2021  Liu  .................... H01L 29/1066

OTHER PUBLICATIONS

Anderson, T. "An AlN/Ultrathin AlGaN/GaN HEMT Structure for Enhancement-Mode Operation Using Selective Etching" IEEE Elec. Dev. Lett. vol. 30 No. 12 Dec. 2009 pp. 1251-1253 (Year: 2009).\*
Meneghini et al. "Technology and Reliability of Normally-Off GaN HEMTs with p-Type Gate." Energies 2017, 10, 153; doi:10.3390/en10020153, published Jan. 25, 2017.

\* cited by examiner

BARRIER STRUCTURE CONFIGURED TO INCREASE PERFORMANCE OF III-V DEVICES

REFERENCE TO RELATED APPLICATION

This application claims the benefit of U.S. Provisional Application No. 62/968,212, filed on Jan. 31, 2020, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and radio frequency (RF) devices has resulted in a significant increase in the use of high voltage transistor devices. Thus, high electron mobility transistor (HEMT) devices have been receiving increased attention due to high electron mobility and wide band gaps compared to silicon-based semiconductor devices. Such high electron mobility and wide band gaps allow improved performance (e.g., fast switching speeds, low noise) and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high electron mobility transistor (HEMT) device includes a heterojunction which is at an interface between two materials having different band gaps and which acts as a channel region of the HEMT. For example, the heterojunction is disposed over a semiconductor substrate and can be disposed between an undoped layer (e.g., comprising a binary III-V semiconductor material such as gallium nitride) and a barrier layer (e.g., comprising a III-V semiconductor material such as aluminum gallium nitride). Additionally, a doped layer (e.g., comprising a binary III-V semiconductor material with a first doping type (e.g., p-type)) is arranged over the heterojunction. Further, a gate electrode is arranged over the doped layer and between a source contact and a drain contact to control current flow between the source and drain contacts of the HEMT.

During operation of the HEMT device, when a suitable voltage bias is applied across the gate electrode and the source and drain contacts, a current flows along the heterojunction. The applied voltage bias controls if the HEMT device operates in an enhancement mode or a depletion mode. In the enhancement mode, the HEMT device uses a gate to source voltage to switch the HEMT device "ON" (e.g., to "turn on" current between source and drain). Thus, in enhancement mode, the HEMT device is a "normally open" switch in some regards. In depletion mode, the HEMT device uses a gate to source voltage to switch the device "OFF" (e.g., to "turn off" current between source and drain). Thus, in depletion mode, the HEMT device is a "normally closed" switch in some regards.

For example, in the enhancement mode for n-channel HEMT devices, the conduction band at the heterojunction has a sharp valley that drops below and intersects the Fermi level, thereby forming a two-dimensional electron gas (2DEG) at the heterojunction when a gate to source voltage (e.g., a threshold voltage) is applied. A concentration of a first element (e.g., aluminum) within the barrier layer is relatively low (e.g., within a range of about 7-25%) due to a low activation rate of the dopants within the doped layer. For example, an activation rate of p-type dopants within a binary III-V semiconductor material (e.g., gallium nitride) is less than an activation rate of p-type dopants within a silicon substrate. By virtue of the relatively low concentration of the first element in the barrier layer, a concentration of 2DEG along the heterojunction is reduced, thereby ensuring the threshold voltage is positive. However, the decreased concentration of 2DEG along the heterojunction increases a resistance of the HEMT while in an "ON" state, and increases depletion of the 2DEG (e.g., resulting in a smaller breakdown voltage), thereby decreasing a performance of the HEMT device.

The present disclosure, in some embodiments, provides a method and a corresponding structure of an HEMT device that comprises a first barrier layer and a second barrier layer with different concentrations of a first element (e.g., aluminum). For example, an undoped layer is formed over a substrate. A first barrier layer (e.g., comprising aluminum gallium nitride) is formed over the undoped layer, where the first element (e.g., aluminum) is a relatively low atomic percentage of the first barrier layer (e.g., within a range of about 7 to 25 atomic percent of the first barrier layer is the first element). A doped layer is formed over the first barrier layer. Subsequently, a second barrier layer (e.g., comprising aluminum gallium nitride) is selectively formed over the first barrier layer, where the first element (e.g., aluminum) is a relatively high atomic percentage of the second barrier layer (e.g., within a range of about 10 to 60 atomic percent of the second barrier layer is the first element). In some embodiments, an atomic percentage of the first element within the second barrier layer is greater than an atomic percentage of the first element within the first barrier layer. Further, the second barrier layer is formed in such a manner that it is laterally offset from a perimeter of the doped layer by a non-zero distance. Finally, a gate electrode is formed over the doped layer, a source contact is formed over the second barrier layer on a first side of the doped layer, and a drain contact is formed over the second barrier layer on a second side of the doped layer opposite the first side. Thus, a concentration of the first element (e.g., aluminum) underlying the doped layer is relatively low, thereby reducing a concentration of 2DEG around the doped layer and ensuring a positive threshold voltage. In addition, a concentration of the first element (e.g., aluminum) underlying the source and drain contacts is relatively high, thereby increasing a concentration of 2DEG around the source and drain contacts. This decreases resistance of the HEMT device while in an "ON" state and decreases depletion of the 2DEG, thereby increasing an endurance and breakdown voltage of the HEMT device. Therefore, an overall performance of the HEMT device is increased.

Figure 1:
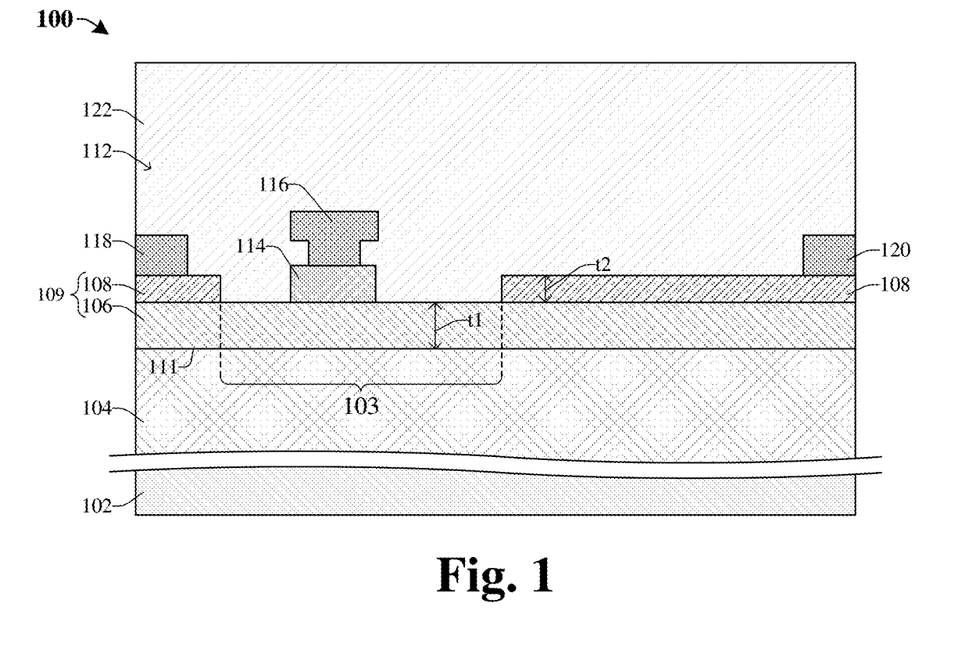
FIG. 1 illustrates a cross-sectional view of some embodiments of an integrated chip including a high electron mobility transistor (HEMT) device having a first barrier layer underlying a second barrier layer.

FIG. 1 illustrates a cross-sectional view of some embodiments of an integrated chip 100 having a first barrier layer 106 underlying a second barrier layer 108.

The integrated chip 100 includes an undoped layer 104 overlying a substrate 102. In some embodiments, the undoped layer 104 may, for example, be or comprise a binary III-V semiconductor material, such as, for example, aluminum nitride, gallium nitride, indium nitride, another suitable semiconductor material, or the like. Further, in some embodiments, the undoped layer 104 may be referred to as an undoped binary III-V semiconductor layer. In further embodiments, the substrate 102 may, for example, comprise silicon, monocrystalline silicon, silicon carbide, sapphire, a bulk silicon substrate, a silicon-on-insulator (SOI) substrate, or another suitable semiconductor substrate material.

A barrier structure 109 overlies the substrate 102, where the barrier structure 109 comprises the first and second barrier layers 106, 108. The first barrier layer 106 overlies the undoped layer 104. In some embodiments, the first barrier layer 106 may comprise a III-V semiconductor material, such as, for example, aluminum gallium nitride, indium aluminum gallium nitride, or another suitable III-V semiconductor material and/or has a first thickness t1. Further, the second barrier layer 108 overlies the first barrier layer 106. In some embodiments, the second barrier layer 108 may comprise an III-V semiconductor material, such as, for example, aluminum gallium nitride, indium aluminum gallium nitride, or another suitable III-V semiconductor material and/or has a second thickness t2. In some embodiments, the first and second barrier layers 106, 108 comprise a same III-V semiconductor material (e.g., aluminum gallium nitride). In various embodiments, a concentration of a first element (e.g., aluminum) within the first barrier layer 106 is less than a concentration of the first element within the second barrier layer 108. In some embodiments, the first element is aluminum, but other elements are amenable. In some embodiments, the first thickness t1 is greater than the second thickness t2. In further embodiments, the first thickness t1 is at least two times greater than the second thickness t2. In some embodiments, the first thickness t1 is within a range of about 8 to 25 nanometers, a range of about 8 to 16 nanometers, or a range of about 16 to 25 nanometers. It will be appreciated that other values for the first thickness t1 are also within the scope of the disclosure. In further embodiments, the second thickness t2 is within a range of about 1 to 10 nanometers, a range of about 1 to 5 nanometers, or a range of about 5 to 10 nanometers. It will be appreciated that other values for the second thickness t2 are also within the scope of the disclosure.

A high electrode mobility transistor (HEMT) device 112 is disposed over the first barrier layer 106. The HEMT device 112 may include a doped layer 114 overlying the first barrier layer 106. A first contact 118 overlies the second barrier layer 108 on a first side of doped layer 114, and a second contact 120 overlies the second barrier layer 108 on a second side of the doped layer 114 that is opposite the first side. Thus, the first and second contacts 118, 120 are separated from one another by the doped layer 114. In addition, a gate electrode 116 overlies the doped layer 114 and is disposed within a dielectric structure 122. In some embodiments, the doped layer 114 may comprise a same material (e.g., gallium nitride) as the undoped layer 104. However, the doped layer 114 comprises a first doping type (e.g., p-type). In further embodiments, the doped layer 114 may, for example, be or comprise a binary III-V semiconductor material, such as, for example, aluminum nitride, gallium nitride, indium nitride, or another suitable semiconductor material with the first doping type. Further, in some embodiments, the doped layer 114 may be referred to as a doped binary III-V semiconductor layer. In addition, an atomic concentration of the first element within the barrier structure 109 may, for example, discretely increase along a first direction that extends from the middle region 103 to a peripheral region that laterally encloses the middle region 103. The second barrier layer 108 is disposed within the peripheral region, and the first direction points from the doped layer 114 to the first contact 118 or the second contact 120.

In some embodiments, a first atomic percentage of the first element (e.g., aluminum) within the first barrier layer 106 is within a range of about 7% to 25%, a range of about 7% to 16%, or a range of about 16% to 25%. It will be appreciated that other values for the first atomic percentage are also within the scope of the disclosure. Further, in some embodiments, a second atomic percentage of the first element (e.g., aluminum) within the second barrier layer 108 is within a range of about 10% to 60%, a range of about 10% to 35%, or a range of about 35% to 60%. It will be appreciated that other values for the second atomic percentage are also within the scope of the disclosure. In further embodiments, the first atomic percentage of the first element within the first barrier layer 106 is less than the second atomic percentage of the first element within the second barrier layer 108. In yet further embodiments, the second barrier layer 108 has a different concentration of elements (e.g., a greater concentration of the first element) than the first barrier layer 106. Further, the doped layer 114 and the gate electrode 116 are disposed laterally within a middle region 103, such that the second barrier layer 108 abuts the middle region 103 and is laterally offset from a perimeter of the doped layer 114 by a non-zero distance.

In some embodiments, the HEMT device 112 is operated in an enhancement mode, where a threshold voltage (e.g., a gate to source voltage) is applied to the gate electrode 116 and the first contact 118 to switch the HEMT device 112 "ON" (e.g., to "turn on" current between the first contact 118 and the second contact 120). Thus, in enhancement mode, the HEMT device 112 is a "normally open" switch in some regards (i.e., "normally open" in the absence of an applied voltage). Further, while applying the threshold voltage to the gate electrode 116 and the first contact 118, a two-dimensional electron gas (2DEG) may form and/or flow along a heterojunction 111 at an interface between the undoped layer 104 and the first barrier layer 106. In some embodiments, the heterojunction 111 may form due to a difference in band gap between the undoped layer 104 and the first barrier layer 106. In addition, the 2DEG may form along the heterojunction 111 because, while applying the threshold voltage, the conductive band at the heterojunction 111 has a sharp valley that drops below and intersects the Fermi level. In some embodiments, in order to ensure the HEMT device 112 is a "normally open" switch, the p-type doping concentration of the doped layer 114 is sufficiently high enough to lift up the conduction band (e.g., above the Fermi level) in the middle region 103 of the HEMT device 112 while the HEMT device 112 is at equilibrium (i.e., in the absence of an applied threshold voltage). This is because the sufficiently high doping concentration of the p-type dopants ensures that there are a sufficient number of available holes to lift up the conduction band above the Fermi level while the HEMT device 112 is at equilibrium.

In some embodiments, dopant activation of p-type dopants (e.g., magnesium (Mg)) within a binary III-V semiconductor material (e.g., gallium nitride) is less and/or slower than dopant activation of p-type dopants within a silicon substrate. This may result in a decreased number of available holes in the doped layer 114. Therefore, reducing the concentration of 2DEG along the heterojunction 111 within the middle region 103 (e.g., by the relatively low atomic percentage of aluminum in the first barrier layer 106) reduces and/or mitigates a recombination of available holes from the doped layer 114 and electrons from the 2DEG along the heterojunction 111. This ensures there are a sufficient number of available holes in the doped layer 114 to lift the conduction band above the Fermi level while the HEMT device 112 is at equilibrium, thereby ensuring the threshold voltage of the HEMT device 112 is positive. Further, in some embodiments, because the concentration of the first element (e.g., aluminum) within the second barrier layer 108 is greater than the concentration of the first element within the first barrier layer 106, a concentration of 2DEG along the heterojunction 111 directly below the first and second contacts 118, 120 is increased. This, in part, increases a number of charge carriers (e.g., 2DEG) near the first and second contacts 118,120, thereby reducing a resistance of the HEMT device 112 while in an "ON" state and increasing a breakdown voltage of the HEMT device 112. For example, the breakdown voltage of the HEMT device 112 may be greater than about 200 volts (V), within a range of about 200 to 1,100V, or another suitable voltage value. Therefore, the relatively low concentration of the first element in the first barrier layer 106 and the relatively high concentration of the first element in the second barrier layer 108 increases a performance and reliability of the HEMT device 112. Further, in some embodiments, the first element (e.g., aluminum) may be referred to as a charge carrier enhancement element because it is configured to increase a concentration of the charge carriers (e.g., 2DEG) disposed along the heterojunction 111.

In some embodiments, if the first atomic percentage of the first element (e.g., aluminum) within the first barrier layer 106 is substantially low (e.g., less than about 7%), then a reliability of the HEMT device 112 is reduced due to electron surface trapping within the middle region 103. In further embodiments, if the first atomic percentage of the first element within the first barrier layer 106 is substantially large (e.g., greater than about 25%), then the threshold voltage of the HEMT device 112 may be negative due to an increased concentration of 2DEG within the middle region 103 while the HEMT device 112 is at equilibrium, such that the HEMT device 112 may not be a "normally open" switch. In yet further embodiments, if the second atomic percentage of the first element (e.g., aluminum) within the second barrier layer 108 is substantially small (e.g., less than about 10%), then a concentration of 2DEG along the heterojunction 111 and directly beneath the first and second contacts 118, 120 is substantially low, thereby increasing a resistance of the HEMT device 112 while in an "ON" state. In various embodiments, if the second atomic percentage of the first element within the second barrier layer 108 is substantially large (e.g., greater than about 60%), then a concentration of 2DEG is increased, thereby increasing an electric field in the HEMT device 112 while in an "ON" state and decreasing a breakdown voltage of the HEMT device 112.

In some embodiments, if the first thickness t1 is relatively low (e.g., less than about 8 nanometers), then a reliability of the HEMT device 112 is reduced due to electron surface trapping. In further embodiments, if the first thickness t1 is relatively large (e.g., greater than about 25 nanometers), then the threshold voltage of the HEMT device 112 may be negative due to an increased concentration of 2DEG within the middle region 103 while the HEMT device 112 is at equilibrium, such that the HEMT device 112 may not be a "normally open" switch. In yet further embodiments, if the second thickness t2 is relatively low (e.g., less than about 1 nanometer), then a reliability of the HEMT device 112 is reduced due to electron surface trapping. In yet further embodiments, if the second thickness t2 is relatively high (e.g., greater than about 10 nanometers), then a concentration of 2DEG is increased, thereby increasing an electric field in the HEMT device 112 while in an "ON" state and decreasing a breakdown voltage of the HEMT device 112. Thus, in some embodiments, a ratio between the first thickness t1 and the second thickness t2 (i.e., t1:t2) may be about 8:1, 2.5:1, or within a range of about 1:1 to 10:1. It will be appreciated that other values for the ratio between the first thickness t1 and the second thickness t2 are also within the scope of the disclosure.

Figure 2:
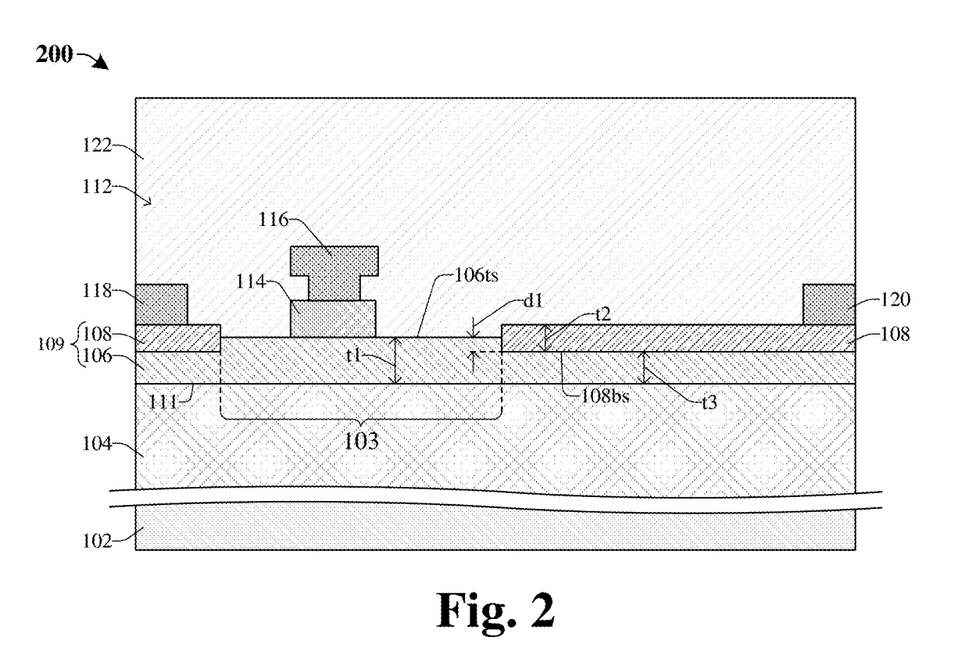
FIGS. 2 and 3 illustrate cross-sectional views of some alternative embodiments of the integrated chip of FIG. 1.

FIG. 2 illustrates a cross-sectional view of an integrated chip 200 according to some alternative embodiments of the integrated chip 100 of FIG. 1, in which a bottom surface 108bs of the second barrier layer 108 is disposed below a top surface 106ts of the first barrier layer 106 by a distance dl. In such embodiments, the first barrier layer 106 comprises the first thickness t1 within the middle region 103 and the second barrier layer 108 comprises the second thickness t2 within a peripheral region laterally outside the middle region 103. Further, the first barrier layer 106 may, for example, comprise a third thickness t3 within the peripheral region that is less than the first thickness t1. In some embodiments, the third thickness t3 is greater than the second thickness t2.

In various embodiments, the distance dl may be within a range of about 0.5 to 1.5 nanometers, about 1.5 to 3 nanometers, about 0.5 to 3 nanometers, or another suitable value. Further, the distance d1 may, for example, be due to the second barrier layer 108 being formed by a selective growth process with a relatively high growth temperature (e.g., within a range of about 700 to 1,200 Celsius), such that at least a portion of the first barrier layer 106 decomposes and/or is removed during the selective growth process. This results in the reduced third thickness t3 of the second barrier layer 108 in the peripheral region that is laterally offset from the middle region 103.

Figure 3:
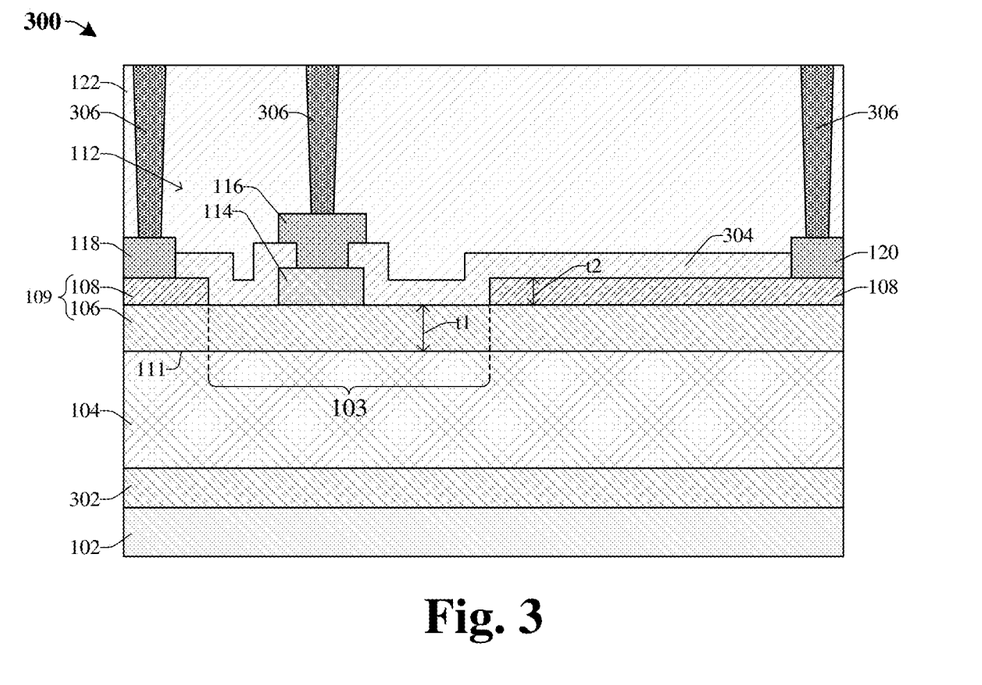

FIG. 3 illustrates a cross-sectional of an integrated chip 300 according to some alternative embodiments of the integrated chip 100 of FIG. 1.

A lower buffer layer 302 is disposed between the substrate 102 and the undoped layer 104. In some embodiments, the lower buffer layer 302 comprises a III-V semiconductor material, such as, for example, aluminum nitride, indium nitride, gallium nitride, aluminum gallium nitride, another suitable material, or any combination of the foregoing. In further embodiments, the lower buffer layer 302 may comprise a single layer comprising the III-V semiconductor material or a multi-layer stack each comprising the III-V semiconductor material (each layer in the multi-layer stack may comprise a different III-V semiconductor material). The lower buffer layer 302 may, for example, serve to compensate for a difference in lattice constants, crystalline structures, thermal expansion coefficients, or any combination of the foregoing between the substrate 102 and overlying layers (e.g., the undoped layer 104, the first barrier layer 106, the second barrier layer 108, etc.). Further, a passivation layer 304 is disposed between the dielectric structure 122 and the first barrier layer 106. In some embodiments, the passivation layer 304 may, for example, be or comprise silicon dioxide, silicon nitride, silicon oxynitride, silicon oxycarbide, another suitable dielectric material, or any combination of the foregoing.

The integrated chip 300 includes conductive vias 306 embedded within the dielectric structure 122. In some embodiments, the dielectric structure 122 may, for example, be or comprise silicon dioxide, a low-k dielectric material, an extreme low-k dielectric material, another suitable dielectric material, or any combination of the foregoing. In further embodiments, the conductive vias 306 may, for example, be or comprise titanium nitride, tantalum nitride, copper, tungsten, aluminum, ruthenium, another suitable conductive material, or any combination of the foregoing. The first contact 118, the second contact 120, and the gate electrode 116 may be electrically coupled to one of the conductive vias 306. The conductive vias 306 may be coupled to voltage sources to control the operation (e.g., "ON" and/or "OFF") of the HEMT device 112. In some embodiments, up to 20 volts may be applied across the HEMT device 112. In other embodiments, the voltage bias applied to the HEMT device 112 may be within a range of about 1 volt to 12 volts. It will be appreciated that other values for the voltage bias applied to the HEMT device 112 are also within the scope of the disclosure. In further embodiments, the gate electrode 116 may be vertically offset from the doped layer 114 (not shown), such that the dielectric structure 122 is disposed between a bottom surface of the gate electrode 116 and a top surface of the doped layer 114.

FIGS. 4-9 illustrate cross-sectional views 400-900 of some embodiments of a method for forming an integrated chip having an HEMT device with a first barrier layer underlying a second barrier layer according to the present disclosure. Although the cross-sectional views 400-900 shown in FIGS. 4-9 are described with reference to a method, it will be appreciated that the structures shown in FIGS. 4-9 are not limited to the method but rather may stand alone separate of the method. Although FIGS. 4-9 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 4:
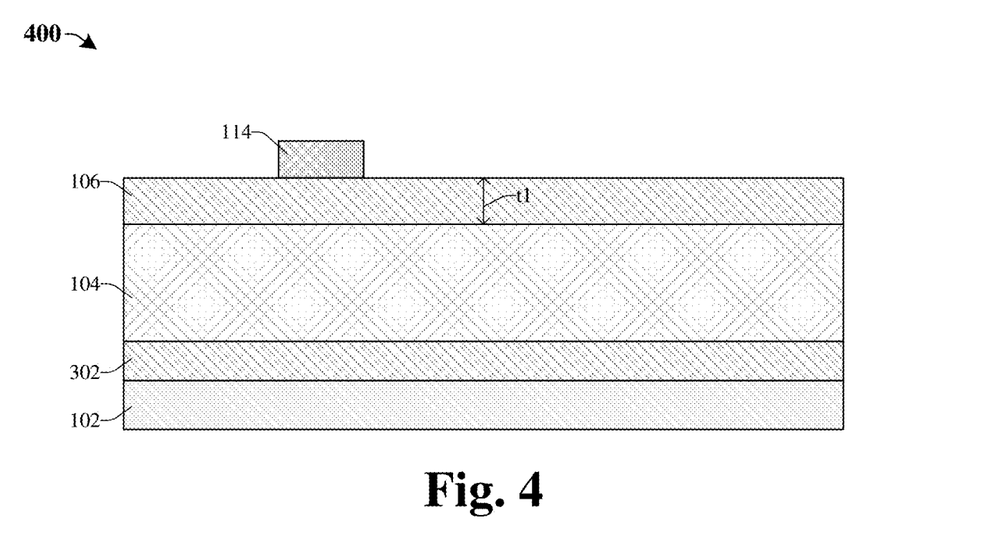
FIGS. 4-9 illustrate cross-sectional views of some embodiments of a method of forming an integrated chip with an HEMT device having a first barrier layer underlying a second barrier layer.

As shown in cross-sectional view 400 of FIG. 4, a substrate 102 is provided and a lower buffer layer 302 is deposited over the substrate 102. In some embodiments, the substrate 102 comprises silicon, sapphire, or silicon carbide. In some embodiments, the lower buffer layer 302 comprises a III-V semiconductor material, such as, for example, aluminum nitride, indium nitride, gallium nitride, aluminum gallium nitride, another suitable material, or any combination of the foregoing. Further, an undoped layer 104 is deposited over the lower buffer layer 302. In further embodiments, the undoped layer 104 may, for example, be or comprise a III-V semiconductor material, or a III-V semiconductor material, such as, for example, aluminum nitride, indium nitride, gallium nitride, or the like.

Also illustrated in FIG. 4, a first barrier layer 106 is deposited over the undoped layer 104 with a first thickness t1. In some embodiments, the first barrier layer 106 may, for example, be or comprise a III-V semiconductor material, such as, for example, aluminum gallium nitride, or another suitable III-V semiconductor material. In some embodiments, the first barrier layer 106 is formed in a manner, such that a first atomic percentage of a first element (e.g., aluminum) within the first barrier layer 106 is, for example, within a range of about 7% to 25%, a range of about 7% to 16%, or a range of about 16% to 25%. It will be appreciated that other values for the first atomic percentage are also within the scope of the disclosure. In some embodiments, the first thickness t1 is within a range of about 8 to 25 nanometers, a range of about 8 to 16 nanometers, or a range of about 16 to 25 nanometers. It will be appreciated that other values for the first thickness t1 are also within the scope of the disclosure.

Further, a doped layer 114 is formed over the first barrier layer 106. In some embodiments, the doped layer 114 may comprise a same material as the undoped layer 104. However, the doped layer 114 comprises a first doping type (e.g. p-type). In further embodiments, the doped layer 114 may, for example, be or comprise a III-V semiconductor material, such as, for example, aluminum nitride, gallium nitride, indium nitride, another suitable III-V semiconductor material, or the like with the first doping type. In some embodiments, a process for forming the doped layer 114 may include: depositing a III-V semiconductor layer over the first barrier layer 106; forming a masking layer (not shown) over the III-V semiconductor layer; patterning the III-V semiconductor layer according the masking layer, thereby defining the doped layer 114; and performing a removal process to remove the masking layer. In further embodiments, after depositing the III-V semiconductor layer, a selective ion implantation process may be performed on the III-V semiconductor layer, where dopants (e.g., magnesium (Mg)) are selectively implanted in the III-V semiconductor layer such that the III-V semiconductor layer comprises the first doping type (e.g., p-type). In yet further embodiments, a deposition process utilized to form the doped layer 114 may include in-situ doping the III-V semiconductor layer with p-type dopants.

In some embodiments, the lower buffer layer 302, the undoped layer 104, the first barrier layer 106, and/or the doped layer 114 may be deposited by an epitaxial process (e.g., vapor-phase epitaxy (VPE), liquid-phase epitaxy (LPE), molecular-beam epitaxy (MBE), some other epitaxial process, or a combination of the foregoing) and/or another form of a deposition process (e.g., chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, any combination of the foregoing, etc.). For example, the first barrier layer 106 may be formed by VPE, LPE, MBE, some other epitaxial process, or a combination of the foregoing. In another example, the doped layer 114 may be formed by an epitaxial process (e.g., VPE, LPE, MBE, some other epitaxial process, or a combination of the foregoing) that in-situ dopes the doped layer 114 with the first doping type (e.g., p-type).

Figure 5:
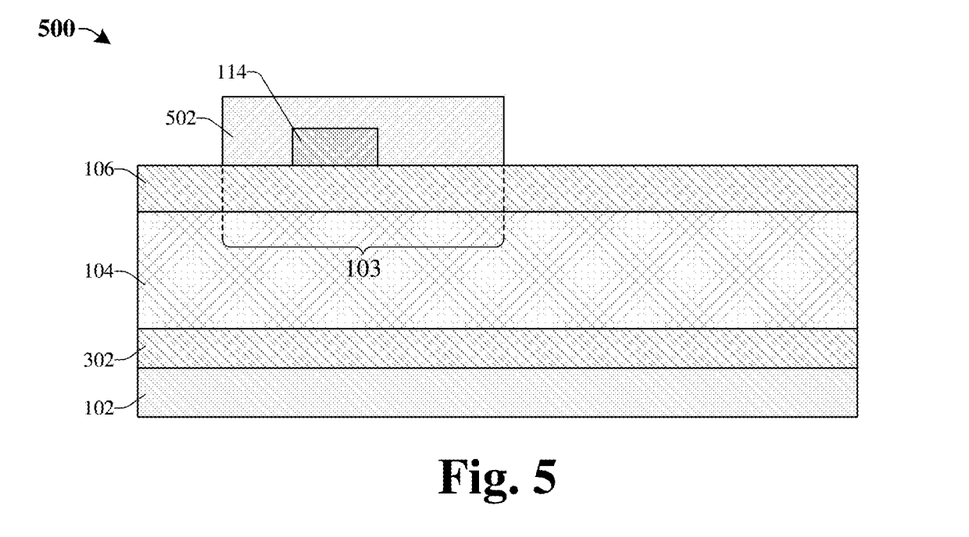

As shown in cross-sectional view 500 of FIG. 5, a masking layer 502 is formed over the doped layer 114. The masking layer 502 and the undoped layer 104 are spaced laterally within a middle region 103. In some embodiments, the masking layer 502 may, for example, be or comprise a photosensitive material, a hard masking material, silicon nitride, silicon carbide, another suitable masking material, or any combination of the foregoing. The masking layer 502 may, for example, be or comprise an oxide, such as silicon dioxide, or another suitable material.

Figure 6:
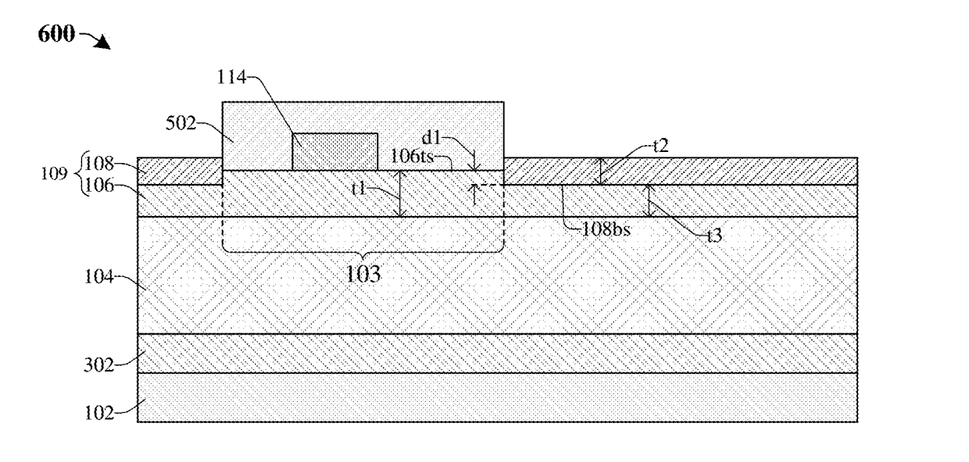

As shown in cross-sectional view 600 of FIG. 6, a selective growth process is performed to selectively deposit a second barrier layer 108 over the first barrier layer 106 in regions laterally offset from the masking layer 502, thereby forming a barrier structure 109. The barrier structure 109 includes the first barrier layer 106 and the second barrier layer 108. In some embodiments, the selective growth process is performed in such a manner to ensure the second barrier layer 108 is not formed over the masking layer 502. In some embodiments, the second barrier layer 108 may, for example, be or comprise a III-V semiconductor material, such as, for example, aluminum gallium nitride. In further embodiments, an atomic percentage of the first element (e.g., aluminum) within the second barrier layer 108 is within a range of about 10% to 60%, a range of about 10% to 35%, or a range of about 35% to 60%. It will be appreciated that other values for the second atomic percentage are also within the scope of the disclosure. In further embodiments, the second barrier layer 108 is formed to a second thickness t2 that is within a range of about 1 to 10 nanometers, a range of about 1 to 5 nanometers, or a range of about 5 to 10 nanometers. It will be appreciated that other values for the second thickness t2 are also within the scope of the disclosure. The selective growth process may be an epitaxial process or another form of a deposition process (e.g., CVD, MO-CVD, PE-CVD, ALD, PVD, sputtering, electron beam/thermal evaporation, etc.) performed at a relatively high regrowth temperature. For example, in some embodiments, the selective growth process may be performed by MO-CVD. Thus, the first barrier layer 106 may be formed by a first deposition process (e.g., an epitaxial process) while the second barrier layer 108 is formed by a second deposition process (e.g., a deposition process such as MO-CVD) different from the first deposition process. In some embodiments, the relatively high regrowth temperature may be within a range of about 700 to 1,200 Celsius, or some other suitable temperature value.

In further embodiments, due to the second deposition process and/or the relatively high regrowth temperature used to form the second barrier layer 108, at least a portion of the first barrier layer 106 laterally offset from the masking layer 502 decomposes and/or is removed. This results in a bottom surface 108bs of the second barrier layer 108 being disposed below a top surface 106ts of the first barrier layer 106 by a distance dl. In such embodiments, the first barrier layer 106 comprises the first thickness t1 within the middle region 103 and the first barrier layer 106 comprises a third thickness t3 within a region laterally offset from the middle region 103. The first thickness t1 is greater than or equal to the third thickness t3. In some embodiments, the third thickness t3 is greater than the second thickness t2. In various embodiments, the distance dl may be within a range of about 0.5 to 1.5 nanometers, about 1.5 to 3 nanometers, about 0.5 to 3 nanometers, or another suitable value. Further, the third thickness t3 may be within a range of about 7.5 to 24.5 nanometers, a range of about 5 to 22 nanometers, or another suitable thickness value.

Figure 7:
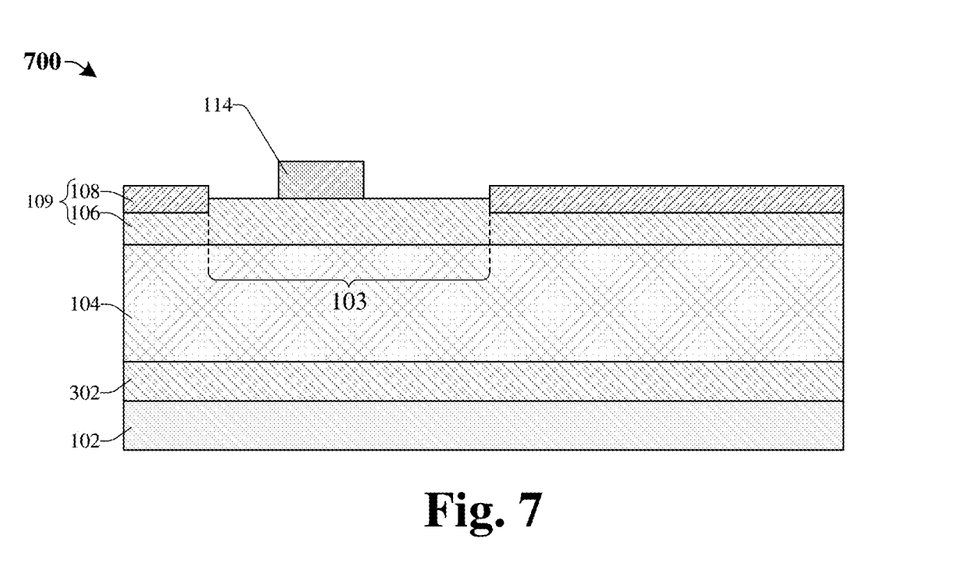

As shown in cross-sectional view 700 of FIG. 7, a removal process is performed to remove the masking layer (502 of FIG. 6). In some embodiments, the removal process includes performing a wet etch process.

Figure 8:
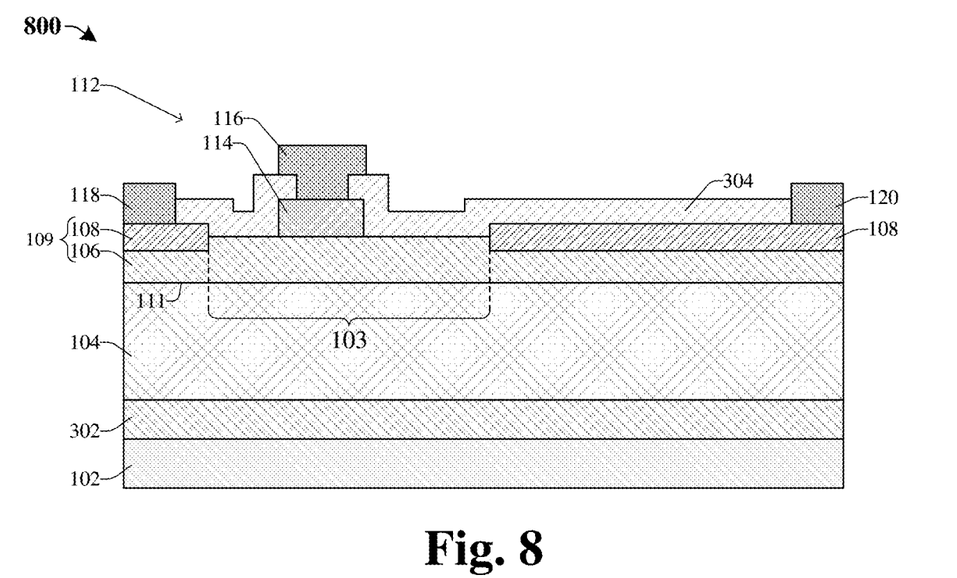

As shown in cross-sectional view 800 of FIG. 8, passivation layer 304 is formed over the first barrier layer 106. In some embodiments, the passivation layer 304 may, for example, be deposited by CVD, PVD, ALD, or another suitable deposition or growth process. Subsequently, a gate electrode 116 is formed over the doped layer 114, and a first contact 118 and a second contact 120 are formed over the second barrier layer 108, thereby forming an HEMT device 112. In some embodiments, a process for forming the gate electrode 116, the first contact 118, and the second contact 120 may include: patterning the passivation layer 304 to define a plurality of openings (not shown); depositing (e.g., by CVD, PVD, sputtering, electroless plating, electro plating, or another suitable deposition or growth process) a conductive layer (e.g., comprising titanium nitride, nickel, tungsten, titanium, platinum, titanium, aluminum, copper, tungsten, another suitable conductive material, or any combination of the foregoing) over the passivation layer 304, such that the conductive layer fills the plurality of openings; forming a masking layer (not shown) over the conductive layer; patterning the conductive layer according to the masking layer, thereby defining the gate electrode 116, and the first and second contacts 118, 120; and performing a removal process to remove the masking layer.

Figure 9:
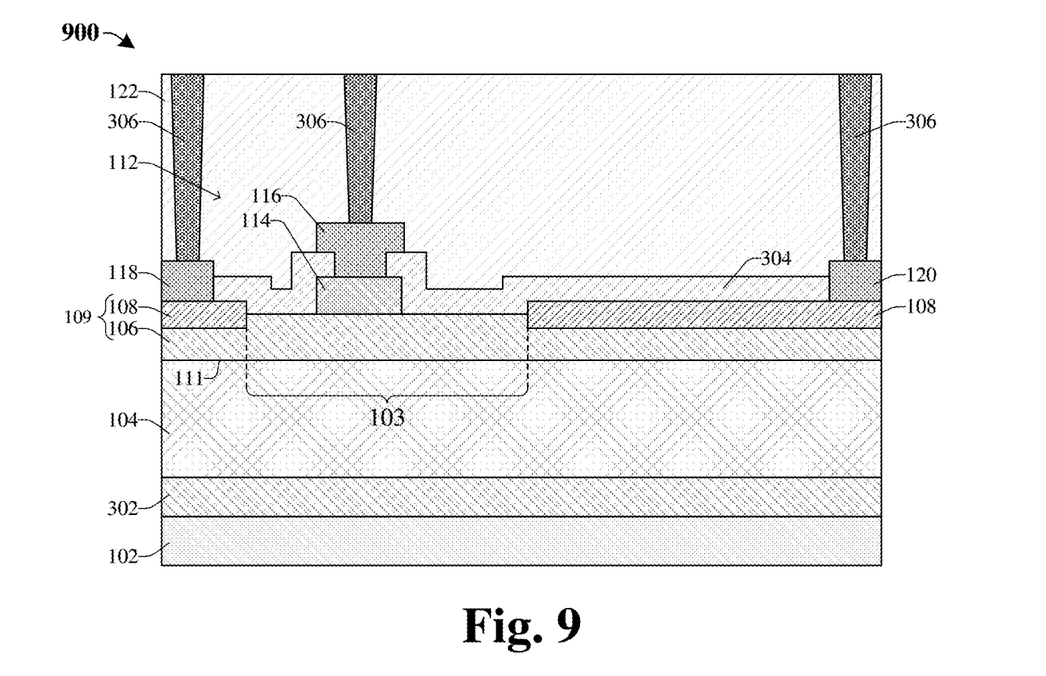

As shown in the cross-sectional view 900 of FIG. 9, a dielectric structure 122 is formed over the HEMT device 112. Subsequently, a plurality of conductive vias 306 are formed within the dielectric structure 122. In some embodiments, the dielectric structure 122 may, for example, be deposited by CVD, PVD, ALD, or another suitable growth or deposition process. In further embodiments, the dielectric structure 122 may, for example, be or comprise silicon dioxide, a low-k dielectric material, an extreme low-k dielectric material, another suitable dielectric material, or any combination of the foregoing. In further embodiments, the conductive vias 306 may be formed by a single damascene process. In addition, in various embodiments, the conductive vias 306 may, for example, be or comprise copper, aluminum, tungsten, titanium nitride, tantalum nitride, ruthenium, another suitable conductive material, or any combination of the foregoing.

Figure 10:
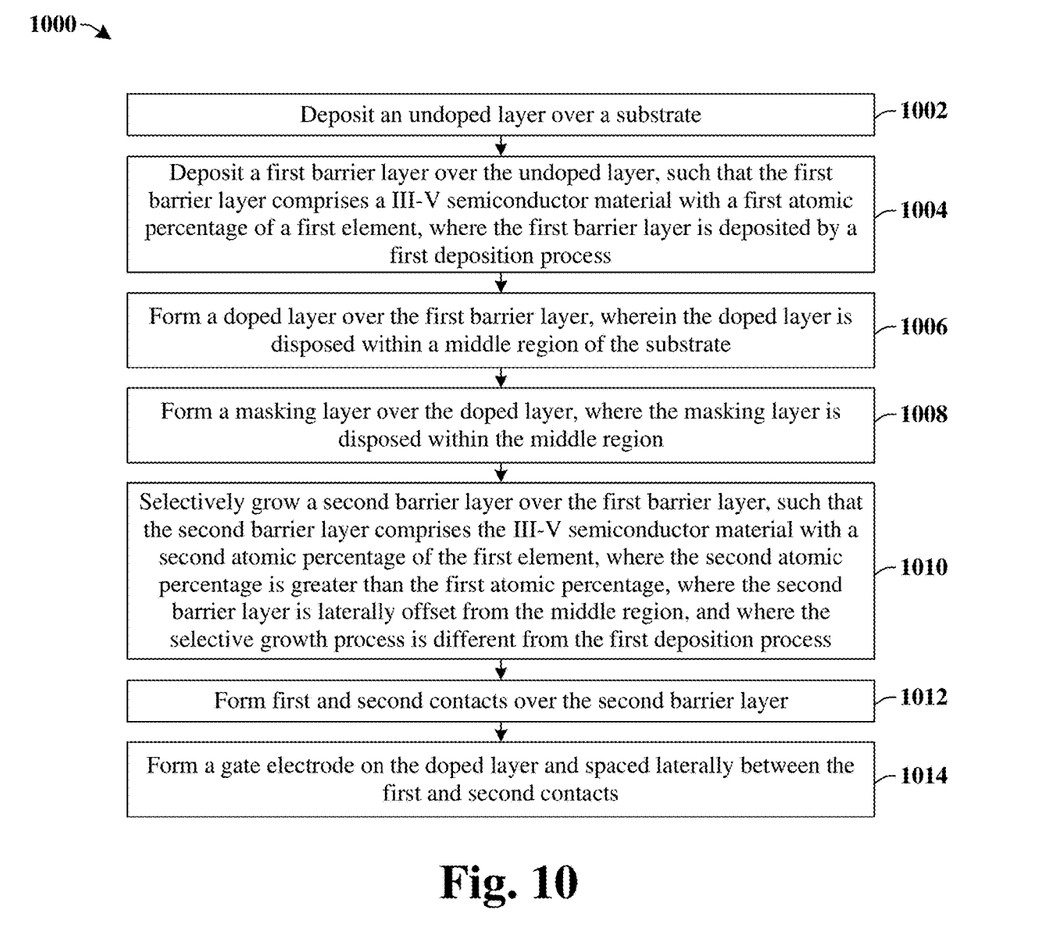
FIG. 10 illustrates a flow diagram of some embodiments corresponding to the method in FIGS. 4-9.

FIG. 10 illustrates a flow diagram of some embodiments of a method 1000 of forming an integrated chip with an HEMT device having a first barrier layer underlying a second barrier layer.

While the method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1002, an undoped layer is deposited over a substrate.

At act 1004, a first barrier layer is deposited over the undoped layer, such that the first barrier layer comprises a III-V semiconductor material with a first atomic percentage of a first element. The first barrier layer is deposited by a first deposition process.

At act 1006, a doped layer is formed over the first barrier layer, where the doped layer is disposed within a middle region of the substrate. FIG. 4 illustrates a cross-sectional view 400 of some embodiments corresponding to acts 1002, 1004, and 1006.

At act 1008, a masking layer is formed over the doped layer, where the masking layer is disposed within the middle region. FIG. 5 illustrates a cross-sectional view 500 of some embodiments corresponding to act 1008.

At act 1010, a second barrier layer is selectively grown over the first barrier layer, such that the second barrier layer comprises the III-V semiconductor material with a second atomic percentage of the first element. The second atomic percentage is greater than the first atomic percentage. The second barrier layer is laterally offset from the middle region, and the selective growth process is different from the first deposition process. FIG. 6 illustrates a cross-sectional view 600 of some embodiments corresponding to act 1010.

At act 1012, first and second contacts are formed over the second barrier layer.

At act 1014, a gate electrode is formed on the doped layer, such that the gate electrode is spaced laterally between the first and second contacts. FIG. 8 illustrates a cross-sectional view 800 of some embodiments corresponding to acts 1012 and 1014.

Accordingly, in some embodiments, the present disclosure relates to a high electron mobility transistor (HEMT) device having a first barrier layer underlying a second barrier layer. The first barrier layer comprises a III-V semiconductor material with a first atomic percentage of a first element, and the second barrier layer comprises the III-V semiconductor material with a second atomic percentage of the first element, where the second atomic percentage is greater than the first atomic percentage.

In some embodiments, the present application provides an integrated chip, including: an undoped layer overlying a substrate; a first barrier layer overlying the undoped layer; a doped layer overlying the first barrier layer; and a second barrier layer overlying the first barrier layer, wherein the second barrier layer is laterally offset from a perimeter of the doped layer by a non-zero distance, wherein the first and second barrier layers comprise a same III-V semiconductor material, wherein a first atomic percentage of a first element within the first barrier layer is less than a second atomic percentage of the first element within the second barrier layer.

In some embodiments, the present application provides an integrated chip, including: a buffer layer overlying a substrate; an undoped binary III-V semiconductor layer overlying the buffer layer; a doped binary III-V semiconductor layer overlying the undoped binary III-V semiconductor layer, wherein the doped binary III-V semiconductor layer is disposed within a middle region of the substrate; and a barrier structure overlying the undoped binary III-V semiconductor layer, wherein the barrier structure comprises a III-V semiconductor material with a first element, wherein an atomic concentration of the first element discretely increases along a first direction that extends from the middle region to a peripheral region, where the peripheral region laterally surrounds the middle region, and wherein the first direction points away from the doped binary III-V semiconductor layer.

In some embodiments, the present application provides a method for forming an integrated chip, the method includes: depositing an undoped layer over a substrate; depositing a first barrier layer over the undoped layer, wherein the first barrier layer comprises a III-V semiconductor material with a first atomic percentage of a first element; forming a doped layer over the first barrier layer; selectively forming a second barrier layer over the first barrier layer such that the second barrier layer is laterally offset from a perimeter of the doped layer by a non-zero distance, wherein the second barrier layer comprises the III-V semiconductor material with a second atomic percentage of the first element, wherein the second atomic percentage is greater than the first atomic percentage; and forming a gate electrode over the doped layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
depositing an undoped layer over a substrate;
depositing a first barrier layer over the undoped layer, wherein the first barrier layer comprises a ternary III-V semiconductor material with a first atomic percentage of a first element;
forming a doped layer over the first barrier layer;
selectively forming a second barrier layer over the first barrier layer such that the second barrier layer is laterally offset from a perimeter of the doped layer by a non-zero distance, wherein the second barrier layer comprises the ternary III-V semiconductor material with a second atomic percentage of the first element, wherein the second atomic percentage is greater than the first atomic percentage; and
forming a gate electrode over the doped layer.

2. The method of claim 1, wherein selectively forming the second barrier layer comprises:

forming a masking layer over the doped layer and the first barrier layer; and performing a selective growth process to form the second barrier layer over the first barrier layer in regions laterally offset from the masking layer.

3. The method of claim 2, wherein the first barrier layer is deposited by an epitaxial process and the selective growth process includes performing a metal organic chemical vapor deposition (MO-CVD) process.

4. The method of claim 1, further comprising:

forming a first contact and a second contact on the second barrier layer and laterally spaced apart from one another by the doped layer.

5. The method of claim 1, wherein the ternary III-V semiconductor material is aluminum gallium nitride.

6. The method of claim 1, wherein a bottom surface of the second barrier layer is disposed below a top surface of the first barrier layer.

7. The method of claim 1, wherein the first barrier layer has a first thickness within a middle region of the substrate, wherein the second barrier layer comprises a second thickness and is laterally offset from the middle region, wherein the first barrier layer has a third thickness within a peripheral region that is laterally offset from the middle region, and wherein the first thickness is greater than the second thickness and the third thickness.

8. The method of claim 7, wherein the third thickness is greater than the second thickness.

9. The method of claim 1, wherein the second barrier layer is selectively formed at a temperature within a range of about 700 to 1200 degrees Celsius.

10. A method of forming an integrated chip, comprising:

depositing an undoped layer over a substrate;

depositing a first barrier layer on the undoped layer, wherein the first barrier layer comprises a ternary III-V semiconductor material;

forming a doped layer on the first barrier layer;

forming a masking layer on the doped layer and laterally within a middle region of the first barrier layer;

selectively forming a second barrier layer directly contacting the first barrier layer with the masking layer in place, wherein the second barrier layer comprises the ternary III-V semiconductor material, wherein the second barrier layer abuts sidewalls of the masking layer;

removing the masking layer;

forming a gate electrode over the doped layer; and forming a first contact and a second contact on the second barrier layer and spaced laterally apart from one another by the gate electrode.

11. The method of claim 10, wherein the first barrier layer has a first atomic percentage of a first element and the second barrier layer has a second atomic percentage of the first element, wherein the second atomic percentage is different from the first atomic percentage.

12. The method of claim 11, wherein the first element is aluminum, the first atomic percentage is within a range of about 7 to 25 percent and the second atomic percentage is within a range of about 10 to 60 percent.

13. The method of claim 11, wherein the first barrier layer has a first thickness and the second barrier layer has a second thickness less than the first thickness.

14. The method of claim 13, wherein the first thickness is within a range of about 8 to 25 nanometers and the second thickness is within a range of about 1 to 10 nanometers.

15. The method of claim 10, wherein the second barrier layer is selectively formed by a metal organic chemical vapor deposition (MO-CVD) process at a temperature within a range of about 700 to 1200 degrees Celsius.

16. The method of claim 10, further comprising:

forming a lower buffer layer between the undoped layer and the substrate.

17. A method of forming an integrated chip, comprising:

depositing an undoped layer over a substrate;

depositing a first barrier layer on the undoped layer by a first deposition process;

forming a doped layer directly on the first barrier layer, wherein the doped layer is spaced within a middle region of the substrate; and depositing a second barrier layer directly on the first barrier layer by a second deposition process different from the first deposition process, wherein the second barrier layer is deposited in a peripheral region laterally offset from the doped layer, wherein the first and second barrier layers comprise a III-V semiconductor material with a first element, wherein a first atomic concentration of the first element in the middle region is less than a second atomic concentration of the first element in the peripheral region, and wherein at least a portion of the first barrier layer decomposes and/or is removed in the peripheral region during the second deposition process.

18. The method of claim 17, wherein the second barrier layer has a first thickness in the middle region and a second thickness in the peripheral region, wherein the first thickness is greater than the second thickness.

19. The method of claim 17, wherein a top surface of the second barrier layer is vertically below a top surface of the doped layer.

20. The method of claim 17, further comprising:

forming a passivation layer over the second barrier layer, wherein the passivation layer continuously extends from a top surface of the second barrier layer, along a sidewall of the second barrier layer, to a top surface of the first barrier layer.

* * * * *